(12) United States Patent
Stefanov et al.

(10) Patent No.: US 7,955,929 B2
(45) Date of Patent: Jun. 7, 2011

(54) METHOD OF FORMING A SEMICONDUCTOR DEVICE HAVING AN ACTIVE AREA AND A TERMINATION AREA

(75) Inventors: Evgueniy Stefanov, Vielle Toulouse (FR); Ivana Deram, Colomiers (FR); Jean-Michel Reynes, Pompertuzat (FR)

(73) Assignee: Freescale Semiconductor, Inc., Austin, TX (US)

( * ) Notice: Subject to any disclaimer, the term of this patent is extended or adjusted under 35 U.S.C. 154(b) by 64 days.

(21) Appl. No.: 12/522,036

(22) PCT Filed: Jan. 10, 2007

(86) PCT No.: PCT/IB2007/000582
§ 371 (c)(1),
(2), (4) Date: Jul. 2, 2009

(87) PCT Pub. No.: WO2008/084278
PCT Pub. Date: Jul. 17, 2008

(65) Prior Publication Data
US 2010/0001344 A1 Jan. 7, 2010

(51) Int. Cl.
*H01L 21/336* (2006.01)
*H01L 21/425* (2006.01)
(52) U.S. Cl. ........ 438/268; 438/531; 438/545; 438/555; 257/329; 257/E21.023
(58) Field of Classification Search .................. 438/268, 438/531, 545, 555; 257/329, E21.023
See application file for complete search history.

(56) References Cited

U.S. PATENT DOCUMENTS

| | | | | |
|---|---|---|---|---|
| 4,134,123 | A | * 1/1979 | Shannon | 257/484 |
| 4,573,066 | A | * 2/1986 | Whight | 257/495 |
| 5,032,878 | A | 7/1991 | Davies et al. | |
| 5,345,101 | A | * 9/1994 | Tu | 257/495 |
| 5,608,244 | A | * 3/1997 | Takahashi | 257/267 |
| 6,037,632 | A | 3/2000 | Omura et al. | |
| 6,274,904 | B1 | 8/2001 | Tihanyi | |

(Continued)

FOREIGN PATENT DOCUMENTS

DE 19816448 C1 9/1999

OTHER PUBLICATIONS

Chen; "A novel high-voltage sustaining structure with buried oppositely doped regions"; IEEE Transactions on Electron Devices, vol. 47, No. 6, Jun. 2000.

(Continued)

*Primary Examiner* — Ngan Ngo

(57) ABSTRACT

A method of forming a semiconductor device having an active area and a termination area surrounding the active area comprises providing a semiconductor substrate, providing a semiconductor layer of a first conductivity type over the semiconductor substrate and forming a mask layer over the semiconductor layer. The mask layer outlines at least two portions of a surface of the semiconductor layer: a first outlined portion outlining a floating region in the active area and a second outlined portion outlining a termination region in the termination area. Semiconductor material of a second conductivity type is provided to the first and second outlined portions so as to provide a floating region of the second conductivity type buried in the semiconductor layer in the active area and a first termination region of the second conductivity type buried in the semiconductor layer in the termination area of the semiconductor device.

20 Claims, 8 Drawing Sheets

U.S. PATENT DOCUMENTS

| | | |
|---|---|---|
| 6,621,122 B2 | 9/2003 | Qu |
| 7,777,292 B2 * | 8/2010 | Ota et al. .............. 257/472 |
| 2005/0048701 A1 * | 3/2005 | Minato et al. .............. 438/135 |
| 2006/0051923 A1 * | 3/2006 | Falck et al. .............. 438/285 |
| 2006/0054895 A1 * | 3/2006 | Ryu et al. .............. 257/77 |
| 2009/0014792 A1 | 1/2009 | Reynes et al. |

OTHER PUBLICATIONS

International Search Report for PCT Application No. PCT/IB2007/000582, Aug. 14, 2007.

* cited by examiner

METHOD OF FORMING A SEMICONDUCTOR DEVICE HAVING AN ACTIVE AREA AND A TERMINATION AREA

FIELD OF THE DISCLOSURE

This disclosure relates to semiconductor device and methods of forming a semiconductor device.

BACKGROUND

Semiconductor devices such as Metal Oxide Semiconductor Field Effect Transistors (MOSFETs) are commonly used as power devices in applications, such as automotive electronics, power supplies, telecommunications, which applications require devices to operate at currents in the range of tenths up to hundreds of amperes (A).

Conventionally, by applying a voltage to the gate electrode of a MOSFET device, the device is turned on and a channel will be formed connecting the source and the drain regions allowing a current to flow. A lightly doped drift region is formed between the drain region and the channel. The drift region is required to be lightly doped in order to lower the maximum electric field that develops across the PN junction (p-body/n-epi) and thus, to ensure a high breakdown voltage. Once the MOSFET device is turned on, the relation between the current and the voltage is nearly linear which means that the device behaves like a resistance. The resistance is referred to as the on-state resistance Rdson.

Typically, MOSFET devices with low on-state resistance Rdson are preferred as they have higher current capability. It is well known that the on-state resistance Rdson may be decreased by increasing the packing density of a MOSFET device i.e. the number of base cells per $cm^2$. For example, a hexagonal MOSFET (HEXFET) device comprises a plurality of cells, each cell having a hexagonal polysilicon gate and source region forming vertices of the hexagonal polysilicon gate, and has a high packing density e.g. $10^5$ hexagonal cells per $cm^2$. Usually, the smaller the size of the cells, the higher is the packing density and thus, the smaller the on-state resistance. Therefore, many improvements to MOSFET devices are aimed at reducing the size of the cells.

However, it is well known that the breakdown voltage of MOSFET devices increases as the on-state resistance Rdson of the devices increases. Thus, there is a trade-off between reducing Rdson and having a high enough break down voltage BVdss.

In an attempt to reduce the on-state resistance Rdson of a MOSFET device whilst not impacting significantly the breakdown voltage of the device, it has been proposed to introduce multilayer structures in the epitaxial region of the device. These are known as super junction structures.

An article entitled 'A Novel High-Voltage Sustaining Structure with Buried Oppositely Doped Regions' by Xing Bi Chen, Xin Wang and Johnny K. O. Sin, in IEEE Transactions on Electron Devices, Vol. 47. No. 6, June 2000 describes a super junction structure having buried floating regions in the drift region of the MOSFET device connected together at the edge termination. In the case of p-type buried floating regions in a n-type drift region, due to the negative charges in the depleted p-type buried floating regions, a large part of the flux induced by the positive charges of the depleted n-drift region are terminated on the buried floating regions so that the electric field intensity is not allowed to accumulate throughout the entire thickness of the drift region. In other words, when the device is in an off state, the potential drop is distributed uniformly in the drift region due to the charge balance across the uniformly distributed buried floating regions and with the result that the peak electric field which develops decreases allowing the voltage capability of the device to be increased. This means that a larger doping concentration can be used in the drift region without producing a high peak field. Since a larger doping concentration in the drift region can be used, the on-state resistance Rdson is reduced. Thus, by using buried floating regions, the resistivity of the drift region can be made smaller than that of a conventional MOSFET device with the same breakdown voltage and therefore, the on-state resistance Rdson can be reduced.

The super junction structures are aimed at improving the voltage capability of the MOSFET device in the active area of the device. The active area is surrounded by a termination area which extends from the active area to the edge of the device (i.e. the edge of the die). A role of the termination area is to provide protection structures which protect the last PN junction in the active area, for example the junction between the last p-type body region and the n-type epitaxial layer of a MOSFET device, from the effects due to the junction curvature effect when the device is in an off state. Without some form of protection, due to the junction curvature effect, the distribution of the potential lines is curved around the last PN junction and a peak electric field develops at the junction near the surface of the epitaxial layer which, when the peak electric field exceeds a critical electric field for the device, is high enough to cause impact ionization avalanche-near the surface. This results in the breakdown voltage capability of the termination area being less than the active area. In order not to reduce the overall breakdown voltage capability of the MOSFET device, there is therefore a desire to increase the breakdown voltage of the termination region such that the breakdown voltage in the termination region is ideally substantially the same as the breakdown voltage in the active area.

Various termination structures have been developed, including field plate structures, field rings, guard rings and floating pylon regions such as those shown in U.S. Pat. No. 6,621,122.

Typically a field plate is formed by a conductive layer, for example a polysilicon layer in some MOSFET devices or a metal layer in diodes, extending several microns from the last PN junction over a field oxide layer in the termination area. In the MOSFET device shown in U.S. Pat. No. 6,621,122, the conductive layer is an extension of the source electrode. The conductive layer acts as a field plate and protects the last PN junction by spreading out the potential lines laterally away from the last PN junction and parallel to the field plate. The result is a reduction in the junction curvature effect at the last PN junction which results in an increase in the critical electric field at which breakdown occurs. However, when the MOSFET device is in an off state, junction curvature effect occurs at the edge of the field plate wherein the distribution of the potential lines is curved around the edge of the field plate and a peak electric field develops near the surface of the epitaxial layer at the edge of the field plate. The magnitude of the peak electric field at the surface of the epitaxial layer reduces the breakdown voltage capability of the termination area by an amount which depends on the thickness of the field oxide.

Thus, in order to avoid a reduction in the breakdown voltage, MOSFET devices having field plates extending into the termination area typically include additional termination structures, such as guard rings, in the termination area surrounding the active area of the device in order to reduce the junction curvature effect for example at the last PN junction and/or at the edge of the field plate.

The super junction MOSFET device described in U.S. Pat. No. 6,621,122 includes vertically connected p-type doped regions formed in pylons in the active area of the device and located under and in contact with p-type body regions. The p-type pylons are also formed in the termination area surrounding the active area and away from the conductive field plate edge towards the edge of the die. The p-type pylons are floating during device operation and increase the blocking capability of the MOSFET device. The width of the p-type pylons in the termination area is wider and their location is non-uniform compared to those p-type pylons in the active area of the device. Forming the p-type pylons from vertically connected p-type buried regions requires a complex manufacturing process which increases the cost of such devices.

U.S. Pat. No. 6,037,632 describes a super junction MOSFET device having p-type buried regions in the active area of the device and large width p-type guard rings used with p-type buried resurf guard rings having a lower doping concentration in the termination area of the device. Additional processing steps, such as forming additional mask layers, are required to create the lower doped buried resurf guard rings. This increases the cost of such devices.

U.S. Pat. No. 5,032,878 describes a termination structure for a high voltage planar device. The termination structure includes guard rings in the surface of the epitaxial layer with the guard rings furthest from the last PN junction being spaced further from each other compared to the guard rings closer to the last PN junction. In addition, an enhancement region of opposite conductivity type to that of the guard rings is formed between the guard rings to increase the punch-through voltage between the rings and thus, the breakdown voltage of the device.

Methods which use guard rings at the surface have a disadvantage in that the size of the device die increases by a significant amount.

There is therefore a need for an improved semiconductor device.

SUMMARY

The present invention provides a semiconductor device and a method of forming a semiconductor device as described in the accompanying claims.

BRIEF DESCRIPTION OF THE DRAWINGS

A semiconductor device and a method of forming a semiconductor device in accordance with the present disclosure will now be described, by way of example only, with reference to the accompanying drawings in which.

DETAILED DESCRIPTION OF THE PREFERRED EMBODIMENTS

In the description that follows and in FIGS. 1-8, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a semiconductor device comprising a vertical semiconductor device such as a N-channel vertical MOSFET device. A vertical semiconductor device comprises a source electrode placed over the drain electrode which results in a current flow mainly in a vertical direction when the device is in the on state. It will be appreciated that the disclosure is not limited to vertical devices nor N-channel MOSFET devices and applies equally to other semiconductor devices, such as lateral devices, P-channel vertical MOSFET devices or insulated gate bipolar transistor (IGBT) devices, or JFETs or diodes or similar devices.

Figure 1:
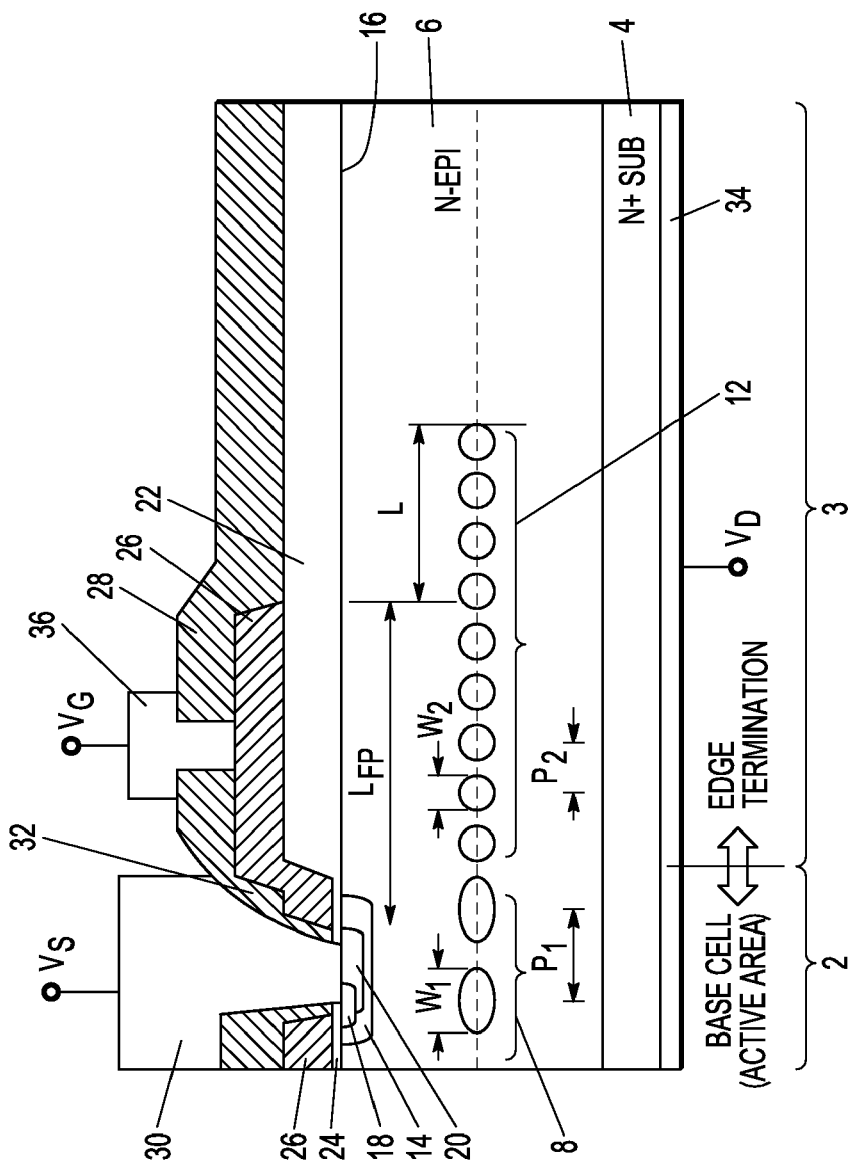
FIG. 1 is a schematic cross-section diagram of a portion of a semiconductor device arrangement in accordance with the disclosure.

Referring now to FIG. 1, a semiconductor device in accordance with an embodiment of the disclosure comprises a N-channel vertical MOSFET device having an active area 2 and a termination area 3 which surrounds the active area 2. A MOSFET device typically comprises a plurality of transistor base cells in the active area 2 having different shapes, such as hexagonal cells, fingers, stripes or waves. FIG. 1 and subsequent FIGs show a simplified cross-sectional view of only a portion of a base cell for simplicity.

The semiconductor device comprises a n-type semiconductor substrate 4 having a first surface and a second surface. A n-type epitaxial layer 6 is formed over the first surface of the semiconductor substrate 4. The doping concentration of the epitaxial layer 6 is less than the doping concentration of the semiconductor substrate 4.

P-type floating regions (only two 8 of which are shown) are formed in the n-type epitaxial layer 6 in the base cells of the active area 2. The p-type floating regions 8 are buried in the n-type epitaxial layer 6 and are junction isolated from external source and drain electrodes. P-type termination regions 12 are formed buried in the n-type epitaxial layer 6 in the termination area 3 of the device. In an embodiment, the termination regions are floating. The doping concentration of the p-type termination regions 12 is less (for example, 2-5 times less) than the doping concentration of the p-type floating regions 8.

The p-type floating regions 8 and the p-type termination regions 12 are formed from a mask layer which is patterned to outline a first mask portion which defines the p-type floating region 8 and has a first width W1 and a second mask portion which defines the p-type termination region 12 and has a second width W2. The first width W1 is arranged to be greater than the second width W2. The distance between a middle of a first mask portion which defines a p-type floating region 8 and a middle of a first mask portion of an adjacent floating region 8 is referred to as first pitch P1. The distance between a middle of a second mask portion which defines a p-type termination region 12 and a middle of a second mask portion of an adjacent termination region 12 is referred to as second pitch P2. The first pitch P1 is arranged to be greater than the second pitch P2. The values for W1, P1, W2, P2 are determined according to the configuration and geometry of the base cells and the types of material and doping concentrations used in the different regions and layers so as to achieve charge balance in the active area and the termination area and to decrease the electric field developed in the termination area during reverse bias.

The method of forming the MOSFET device of FIG. 1 will be described in more detail below.

In the embodiment shown in FIG. 1, p-type termination regions 12 all have the same configuration and doping concentration.

In another embodiment (not shown), the termination area 3 includes one p-type termination region (such as one of the second p-type termination regions 12) having a doping concentration that is lower than the doping concentration of the p-type floating region 8 in the active area, In another embodiment (not shown), the termination area 3 includes a plurality of p-type termination regions arranged to having doping concentrations which decrease across the termination area 3 away from the active area 2 with the termination region adjacent the active area having the same or lower doping concentration to that of the floating region 8 in the active area.

Irrespective of the combination of termination regions and hence the doping concentration profile used, at least one of the termination regions in the termination area 3 has a peak doping concentration that is less (for example 2-5 times lower) than the doping concentration of the floating region 8 in the active area. In the embodiments having a plurality of termination regions each with varying doping concentration, the peak doping concentrations of the termination regions are arranged such that the doping concentration profile decreases across the termination area 3 away from the active area 2. This provides for the space charge region in the termination region 3 to have a greater width laterally and increases the breakdown voltage.

The number of termination regions in the termination area 3 will depend on the required breakdown voltage. For example, higher breakdown voltages will require more termination regions in the termination area 3. A low breakdown voltage of say 100 volts may only require one termination region.

The required breakdown voltage and the device robustness will define the choice of doping concentration profile across the termination regions.

A p-type body region 14 extends from a first surface 16 of the epitaxial layer 6 through the epitaxial layer 6 typically to a depth of 1.5 microns. A n-type region 18 extends from the first surface 16 of the epitaxial layer 6 into the p-type body region 14. The n-type region 18 is the current electrode region of the semiconductor device. In the embodiment shown in FIG. 1, the n-type region 18 is the source region 18 of the MOSFET device and the semiconductor substrate 4 forms the drain region of the device. An additional p-type region 20 extends into the p-type body region 14 from the first surface 16 of the epitaxial layer 6 and so as to be adjacent the n-type region 18. The doping concentration of the additional p-type region 20 is greater than the doping concentration of the p-type body region 14. P-type region 20 improves contact with the source electrode and with the body region 14. The latter reduces the parasitic NPN bipolar action in the body region 14 and avoids vertical punch-through between the source region 18 and the n-type epitaxial layer 6.

A field oxide layer 22, having a typical thickness of 0.7 microns, extends over the first surface 16 of the epitaxial layer 6 and a gate oxide layer 24 extends over the first surface 16 of the epitaxial layer 6 over body region 14. Gate oxide layer 24 typically comprises a silicon oxide layer having a thickness of 0.06 microns depending on the operating voltage. An insulated gate region 26 is formed over gate oxide layer 24 and field oxide layer 22 and typically comprises a doped polycrystalline semiconductor material such as polysilicon. A dielectric layer 28 is formed over the insulated gate region 26. The dielectric layer 28 may comprise a silicon oxide layer or may comprise several layers, such as oxide/nitride/oxide layers.

In the embodiment shown in FIG. 1, the MOSFET device is arranged to have a field plate formed by the insulated gate region 26 extending over the oxide layer 22 from the last PN junction formed between the p-type body region 14 and the epitaxial layer 6. The field plate protects the last PN junction against high reversed bias as discussed in the introduction and thus provides advantages when used in power devices. Not all devices require such a field plate and thus, the present invention is not limited to semiconductor devices having a field plate extending into the termination area 3.

Figure 2:
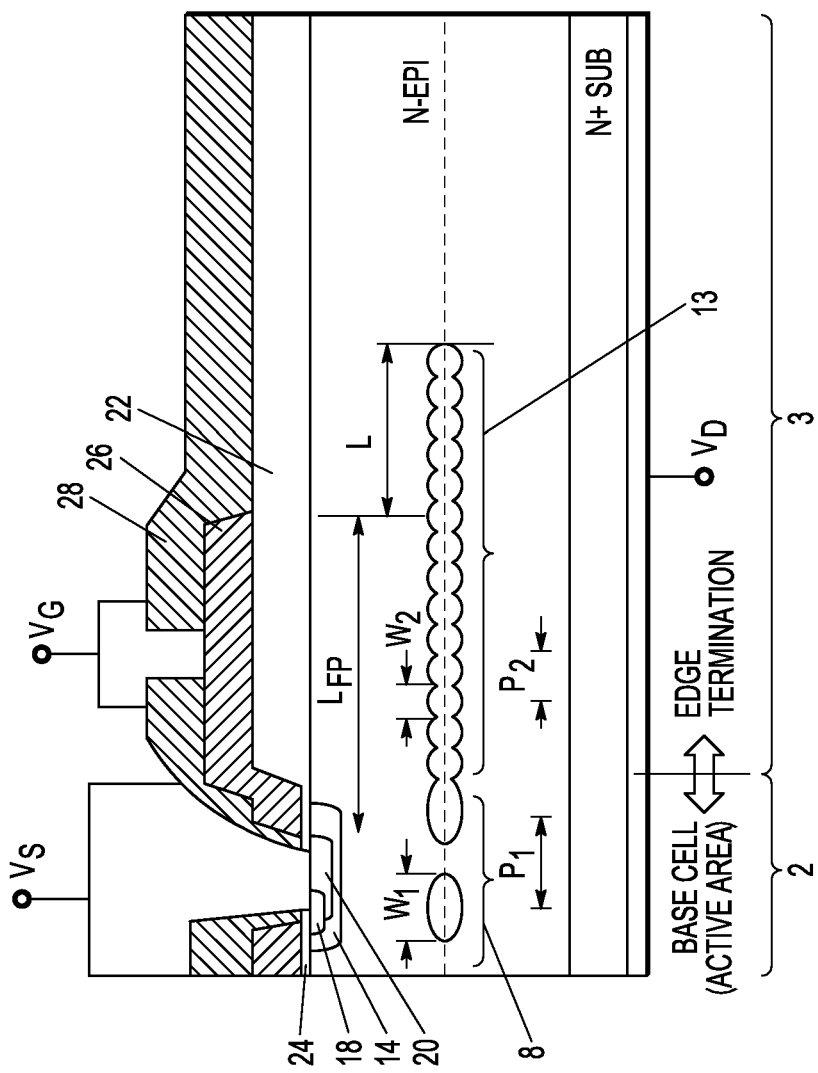
FIG. 2 is a schematic cross-section diagram of a portion of a semiconductor device arrangement in accordance with another embodiment of the disclosure.
Figure 3:
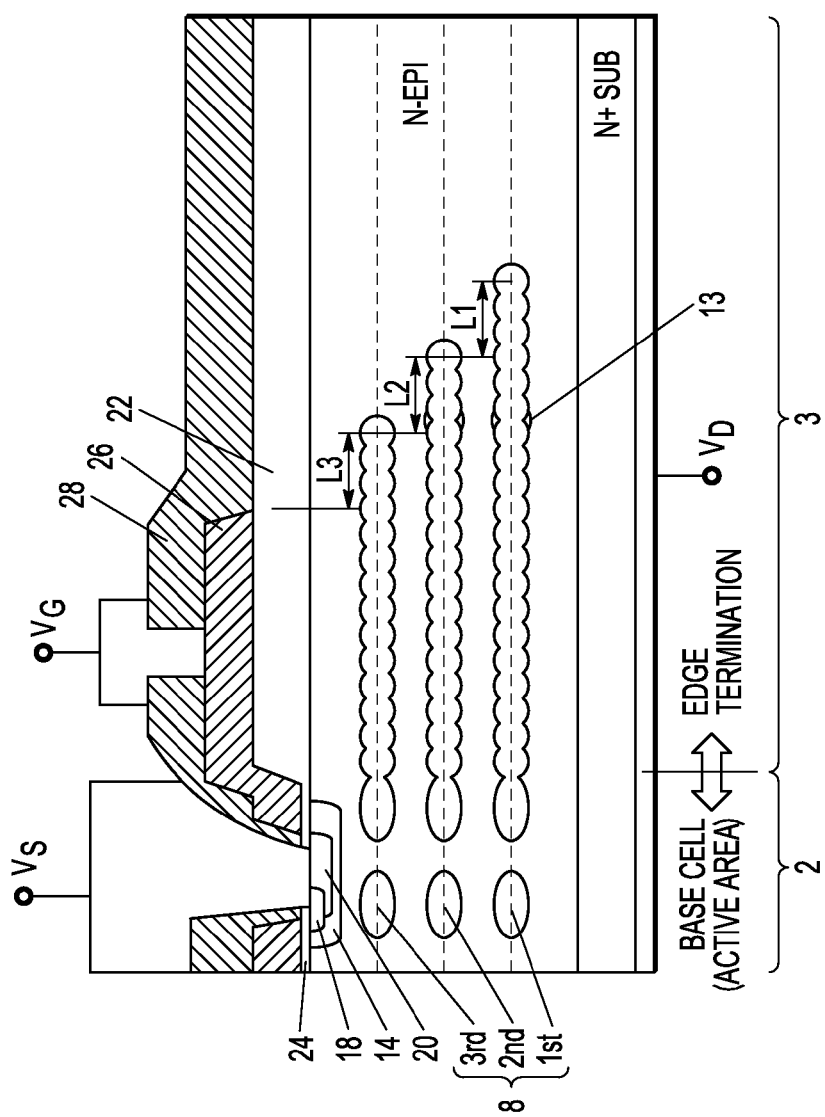
FIG. 3 is a schematic cross-section diagram of a portion of a semiconductor device arrangement in accordance with another embodiment of the disclosure.

In the embodiment shown in FIG. 1 which includes a field plate, the termination regions 12 are located in the epitaxial layer 6 such that they extend beyond the edge of the field plate. A distance L represents the distance by which the termination regions 12 extend beyond the edge of the field plate. In other words, the distance L is the distance between the edge of the field plate and, for an embodiment comprising a plurality of termination regions (12), the termination region furthest from the active area 2. In an embodiment comprising one termination region 12 or a merged termination region 13 (as shown in FIGS. 2 and 3), the termination region is arranged to extend across the termination area 3, to a distance L from the edge of the field plate. The distance L varies according to the desired breakdown voltage and the thickness of the field oxide 22. The distance L must be at least one space charge width of silicon (assuming the epitaxial layer 6 is a silicon epitaxial layer) at the breakdown voltage bias. For a device requiring a 200 volt breakdown voltage and having a field oxide thickness of 0.7 microns, the distance L may be in the range of 10 to 15 microns. For larger breakdown voltages, the distance L will be greater.

The distance LFP represents the length of the field plate which is formed by the insulated gate region 26 from the last PN junction between the p-type body region 14 and the epitaxial layer 6 at the surface 16. The distance LFP may be between 10-40 microns depending on the metal design rules.

A metal or ohmic layer 30 is formed over the dielectric layer 28 and contacts the source region 18 to form the source electrode. A spacer 32 isolates the metal layer 30 from the insulated gate region 26.

A metal or ohmic layer 34 is formed over the second surface of the semiconductor substrate 4 to form the drain electrode.

A metal or ohmic layer 36 is formed over the dielectric layer 28 and contacts the insulated gate region 26 to form the gate electrode.

FIG. 2 shows another embodiment of the disclosure which is similar to the embodiment shown in FIG. 1 except that the termination regions 12 of FIG. 1 in the embodiment shown in FIG. 2 have an associated distance between two adjacent termination regions which is less than the lateral spread of the termination regions 12 so that the termination regions 12 merge to form a merged termination region 13. Like elements to those of FIG. 1 are referenced by the same reference numeral. The merged termination region 13 may have a constant doping profile across the merged termination region or the doping profile may vary across the merged termination region such that it decreases across the merged termination region away from the active area 2.

FIG. 3 shows another embodiment of the disclosure which is similar to the embodiment shown in FIG. 2 except that the semiconductor device comprises a plurality of buried p-type floating regions 8 stacked vertically in different layers in the active area, and a plurality of merged termination regions 13 stacked vertically in different layers in the termination area 3. Like elements to those of FIG. 2 are referenced by the same reference numeral. The merged termination regions 13 are formed such that the merged termination regions in the different layers extend across the termination area 3 by different distances. The lowest merged termination region 13 extending a further distance across the termination area 3 than the merged termination region 13 in the adjacent layer and so on. It will also be appreciated that the arrangement of having stacked termination regions extending across the termination area 3 by different (positive or negative) distances in the different layers may also apply to non-merged termination regions as shown, for example, by the termination regions 12 of FIG. 1.

When any one of the MOSFET devices shown in FIGS. 1-3 does not have termination structures in the termination area 3, due to the junction curvature effect, when the device is in an off state, the distribution of the potential lines would curve around the last p-type body region 14 in the active region 2 at the edge of the device and create a peak electric field at the PN junction between the p-type body region 14 and the epitaxial layer 6 close to the surface 16. The peak electric field may be high enough to cause impact ionization avalanche at the PN junction. This would limit the critical electric field at which breakdown occurs.

In addition, for a device having a field plate extending into the termination area, due to the junction curvature effect, the distribution of the potential lines would be parallel to the surface 16 under the field plate but would curve in the epitaxial layer towards the edge of the field plate and create a peak electric field at the interface between the field oxide 22 and epitaxial layer 6 at the surface 16. The peak electric field may be high enough to cause impact ionization avalanche at the surface 16. This would also limit the breakdown voltage capability.

By having at least one termination region in the termination area 3, the semiconductor device in accordance with the disclosure spreads the curvature of the potential lines beyond the last PN junction formed between the p-type body region 14 and the epitaxial layer 6. In addition, by having at least one termination region in the termination area 3 having a lower doping concentration compared to the floating regions 8 in the active area 2, the space charge region is spread laterally and vertically in the termination area 3 which improves the flatness of the equi-potential lines in the bulk of the semiconductor device and laterally from the last PN junction. The result is that breakdown occurs in the bulk of the device in the active area 2 which improves the voltage capability of the device and so improves the device trade-off between BVdss and Rdson.

In an embodiment in which the semiconductor device comprises a field plate, the at least one termination region is arranged to extend beyond the edge of the field plate by a predetermined distance, L. By having at least one termination region that extends beyond the edge of the field plate, the at least one termination region increases the width of the space charge region beyond the field plate edge such that the curvature of the potential lines is spread beyond the edge of the field plate. The result is that the junction curvature effect does not occur at the field plate edge so that the peak electric field is not concentrated at the surface of the epitaxial layer around the edge of the field plate during depletion when the device is in an off state. By avoiding a peak electric field developing at the field plate edge, the breakdown voltage capability of the termination area 3 is improved.

The stacked arrangement shown in FIG. 3 may be used for higher voltage devices where the epitaxial layer is thicker.

Thus, the structure of the termination area in accordance with the present disclosure provides improved breakdown voltage capability close to plane parallel PN junction breakdown, which improves the device trade-off between BVdss and Rdson. In other words, in the off state for the same device dimension, and geometry, the Rdson can be reduced for the same breakdown voltage by, for example, increasing the dopant concentration in the drift region.

A method of forming a semiconductor device in accordance with an embodiment of the present disclosure will now be described with reference to FIGS. 4-8. Only part of the semiconductor device is shown for simplicity.

Figure 4:
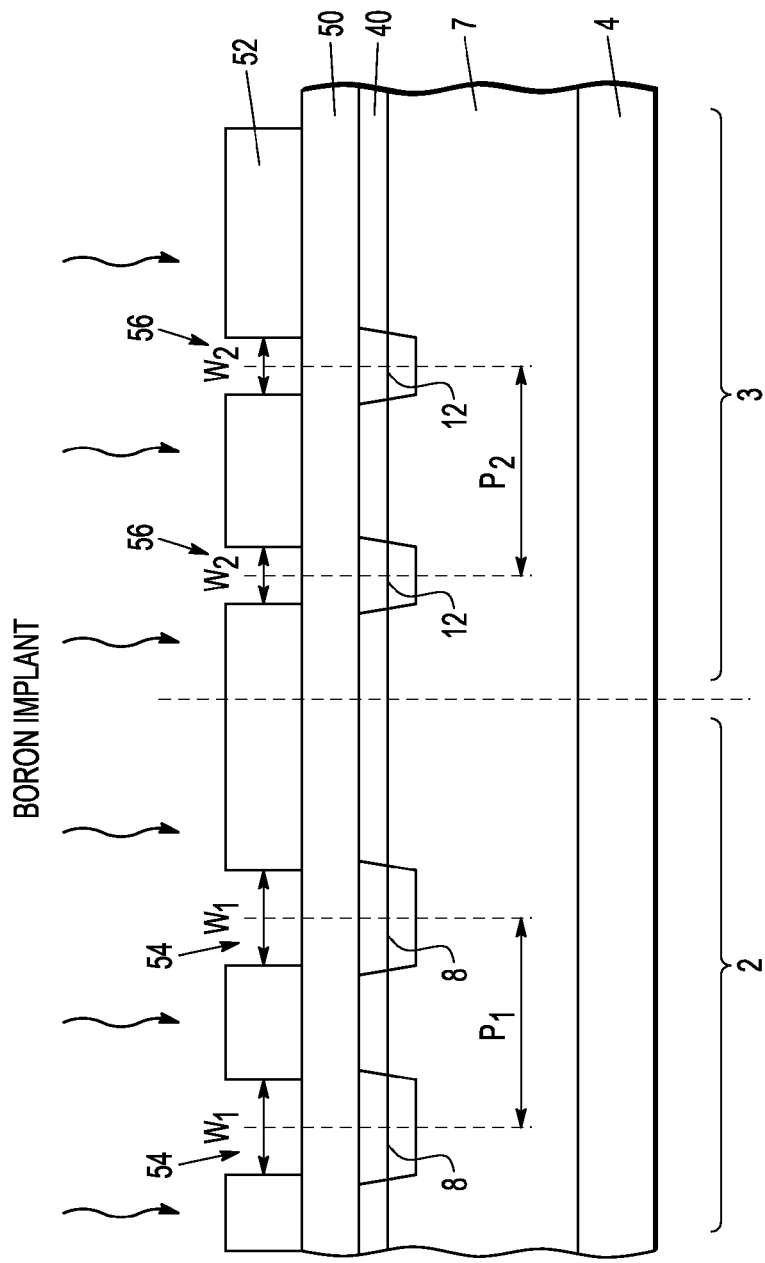
FIGS. 4, 6-8 are schematic cross-section diagrams of the portion of the semiconductor device of FIG. 1 during different stages of fabrication.

As shown in FIG. 4, a first part 7 of an n-type epitaxial layer 6 is grown on an n-type substrate 4. The doping concentration of the n-type substrate 4 is greater than the doping concentration of the first part 7 of epitaxial layer 6. An oxide layer 50, such as a silicon oxide layer, is formed over the first part 7 of the epitaxial layer 6. In an embodiment, a n-type blanket implant is performed through the oxide layer 50 in order to provide an enhancement region 40. See for example the method described in U.S. Pat. No. 5,032,878. The implant doping dose of the enhancement region is, for example, 1e12 $cm^{-2}$ and ensures a doping concentration which is greater than the doping concentration of the first part 7 of the epitaxial layer 6. The thickness of the enhancement region after processing is in the range 1-2 microns. A mask layer 52 is then formed over the first part 7 of the epitaxial layer 6. First 54 and second 56 openings are formed in the mask layer 52. The first opening 54 has a first width W1 and the second opening has a second width W2. The first width W1 is greater than the second width W2. The first pitch P1 is arranged to be greater than the second pitch P2.

Floating regions 8 and termination regions 12 are then formed within the enhancement region 40 in the first part 7 of the epitaxial layer 6 by implantation or diffusion of a p-type material, such as boron (B11+), in the first part 7 of the epitaxial layer 6 through the openings 54 and 56.

In an alternative embodiment, the enhancement region 40 may be omitted.

Figure 5:
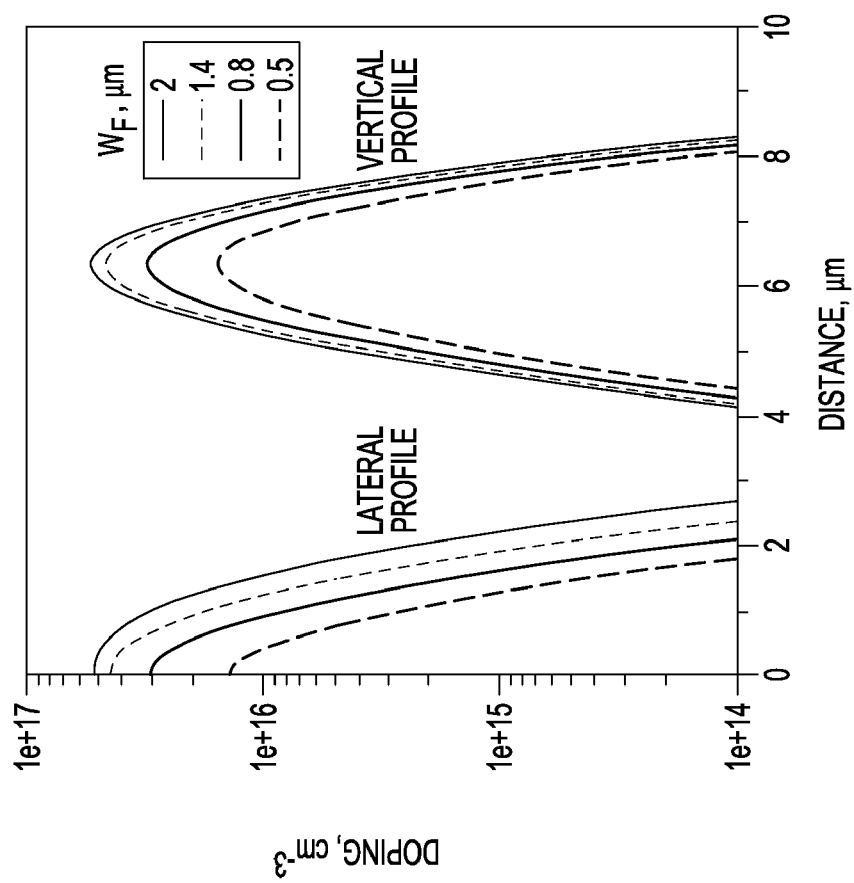
FIG. 5 is a graph showing the relationship between the width of a mask opening for a region and the doping profile of the region.

An IEEE article entitled, 'Variation of Lateral Doping—A New Concept to Avoid High Voltage Breakdown of Planar Junctions' by R. Stengl and U. Gosele, in International Electron Device Meeting, Vol. 31, pages 154-157 (1985) describes a planar junction being formed with a graded doping profile by varying the widths of openings in a mask. FIG. 5 shows the relationship between the width $W_F$ of a mask opening and the doping concentration. As can be seen from FIG. 5, as the width of the mask opening decreases, the doping concentration decreases both laterally and vertically for a given high temperature drive operation.

The doping profile between the floating regions 8 and the termination regions 12 and between the termination regions 12 themselves are varied by using one mask layer having different widths and/or pitches for the mask portions which define the different regions.

It will be appreciated that in order to form the different combinations of termination regions outlined above (particularly with reference to FIG. 1), this can be achieved by providing a mask layer 52 with the appropriate number of openings having the appropriate widths and distance or space between adjacent openings. For example, the merged termination region 13 of FIG. 2 is formed by merging termination regions, for example, by arranging for the space or distance between adjacent openings which form the termination regions to be less than a lateral spread of the implanted p-type material in the epitaxial layer 6. In an alternative embodiment, the second pitch P2 and/or second width W2 is varied away from the active area 2.

The layout of the mask layer 52 is arranged so that the shape of the termination regions 12 can be one of stripes, dots, mesh shapes, cross-shapes or any combination thereof.

Figure 6:
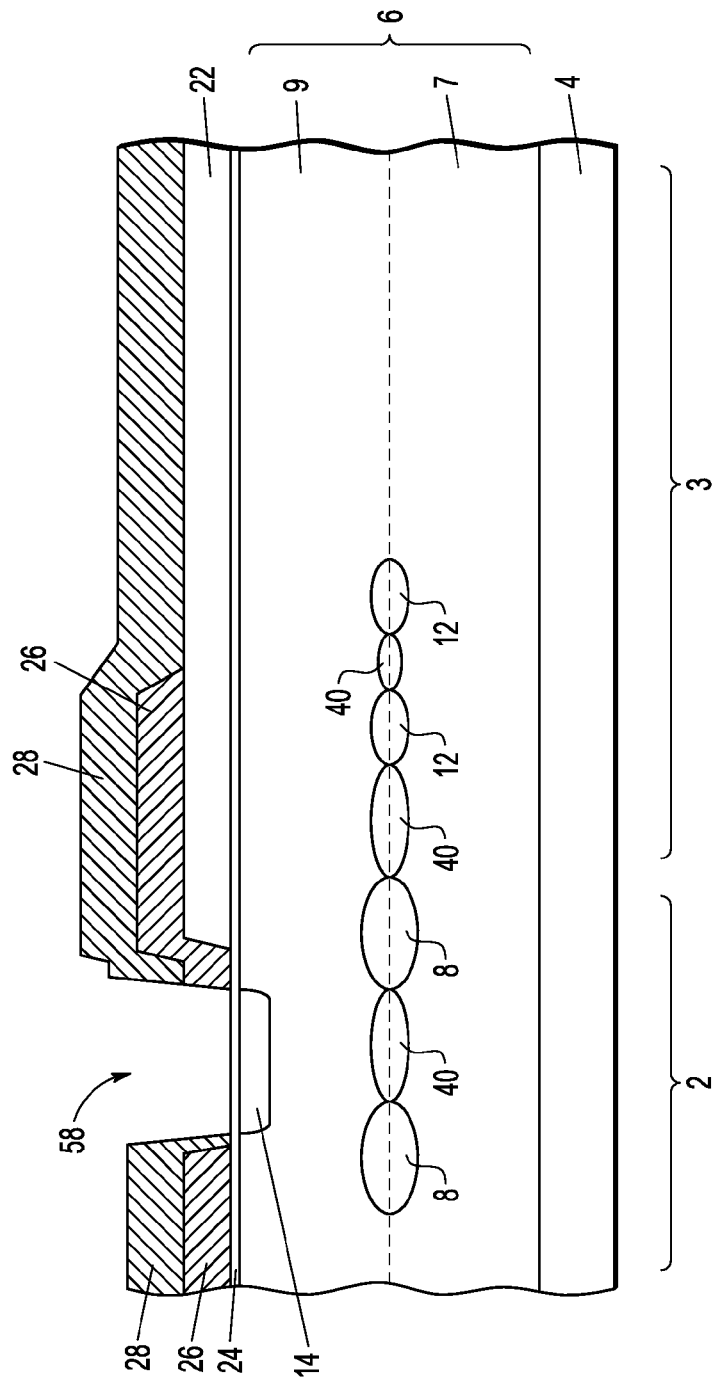

After the floating regions 8 and termination regions 12 are formed in the first part 7 of the epitaxial layer 6, the mask layer 52; and oxide layer 50 are removed and a second part 9 of the epitaxial layer is grown over the floating regions 8 and the termination regions 12 as shown in FIG. 6. The first part and second part form the epitaxial layer 6 shown in FIG. 1. In arrangements comprising a plurality of floating and termination regions stacked vertically, the floating regions are formed by alternating between growing part of the epitaxial layer, forming the floating regions from a p-type layer and then growing another part of the epitaxial layer over the formed floating regions.

Thus, the semiconductor device includes floating regions 8 buried in the epitaxial layer 6 in the active area 2, termination regions 12 buried in the epitaxial layer 6 in the termination area 3 and enhancement regions 40 between the termination regions 12 and between the floating regions 8. In alternative embodiments, the enhancement regions 40 may be omitted or the enhancement regions may be provided only between the floating regions 8 or the termination regions 12.

A dielectric layer 22, such as a silicon oxide layer, is then formed over the device. A first opening (not shown) is made through the dielectric layer 22 (the field oxide layer 22) by way of patterning and etching and a dielectric layer 24, the gate oxide layer 24, is grown on the epitaxial layer 6 in the first opening (not shown). A polysilicon layer 26, or other type of conductive layer, is then formed over the gate oxide layer 24 and the field oxide layer 22, for example, by deposition. A dielectric layer 28 is then deposited over the polysilicon layer 26. The dielectric layer 28 may comprise a silicon oxide layer or may comprise several layers, such as oxide/nitride/oxide layers.

The dielectric layer 28 and the polysilicon layer 26 are then etched to provide a body opening 58 through which the p-type body region 14 may be formed in the epitaxial layer 6. The etched polysilicon layer 26 forms the insulated gate region 26 of the MOSFET device.

The p-type body region 14 is then formed by implantation or diffusion of a p-type material, such as boron (B11+), in the epitaxial layer 6 through the body opening 58. Preferably, a doping dose in the range of 5e13 cm$^{-2}$ is used. The wafer is then subjected to a high temperature, for example around 1080° C., to drive the p-type body region 14 into the epitaxial layer 6 as shown in FIG. 7.

Figure 7:
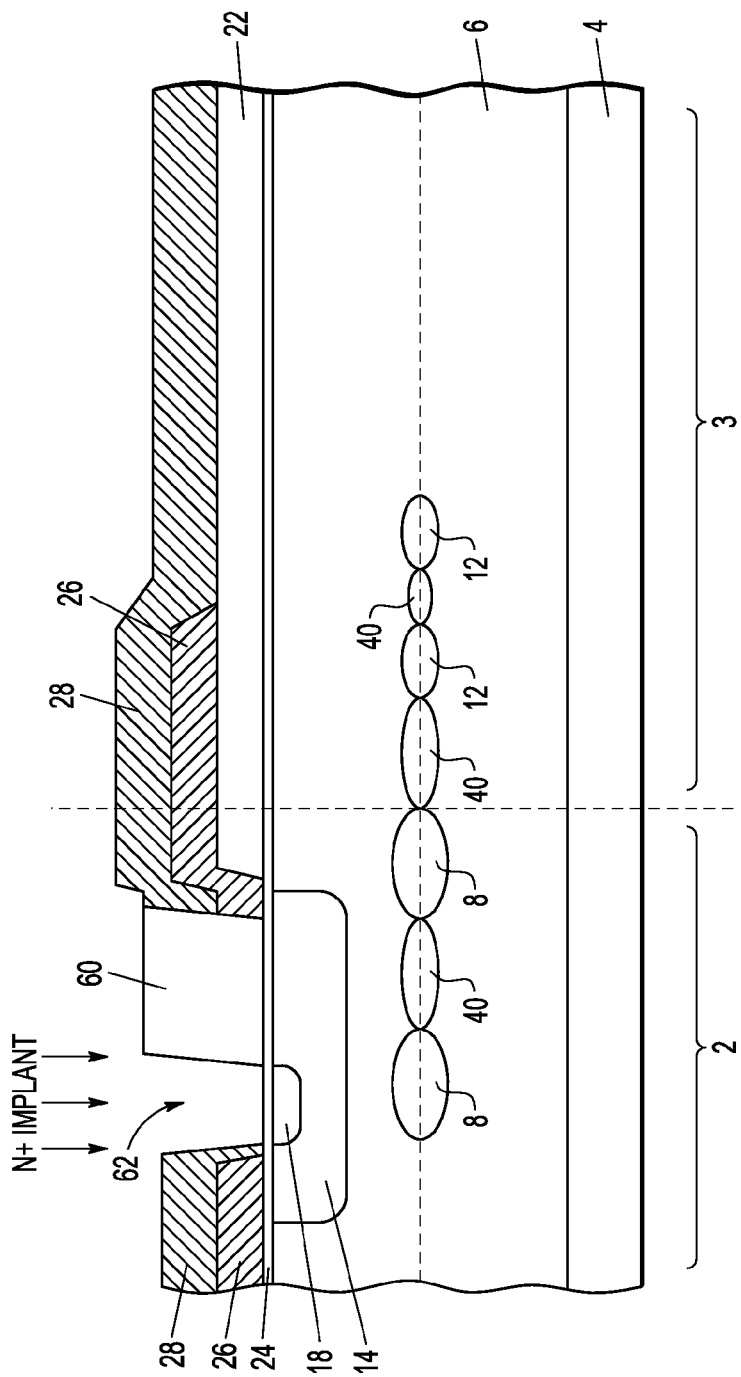

A mask 60 is formed over a portion of the dielectric layer 28 to mask off the body opening 58 and leave an opening 62 as shown in FIG. 7. The source region 18 is then formed by implantation of a n-type material, such as arsenic or phosphorus, into the epitaxial layer 6. Since the source region 18 is implanted through the opening 62 which is defined by the mask 60 and the insulated gate region 26, the source region 18, and the body region 14 are self-aligned.

Figure 8:
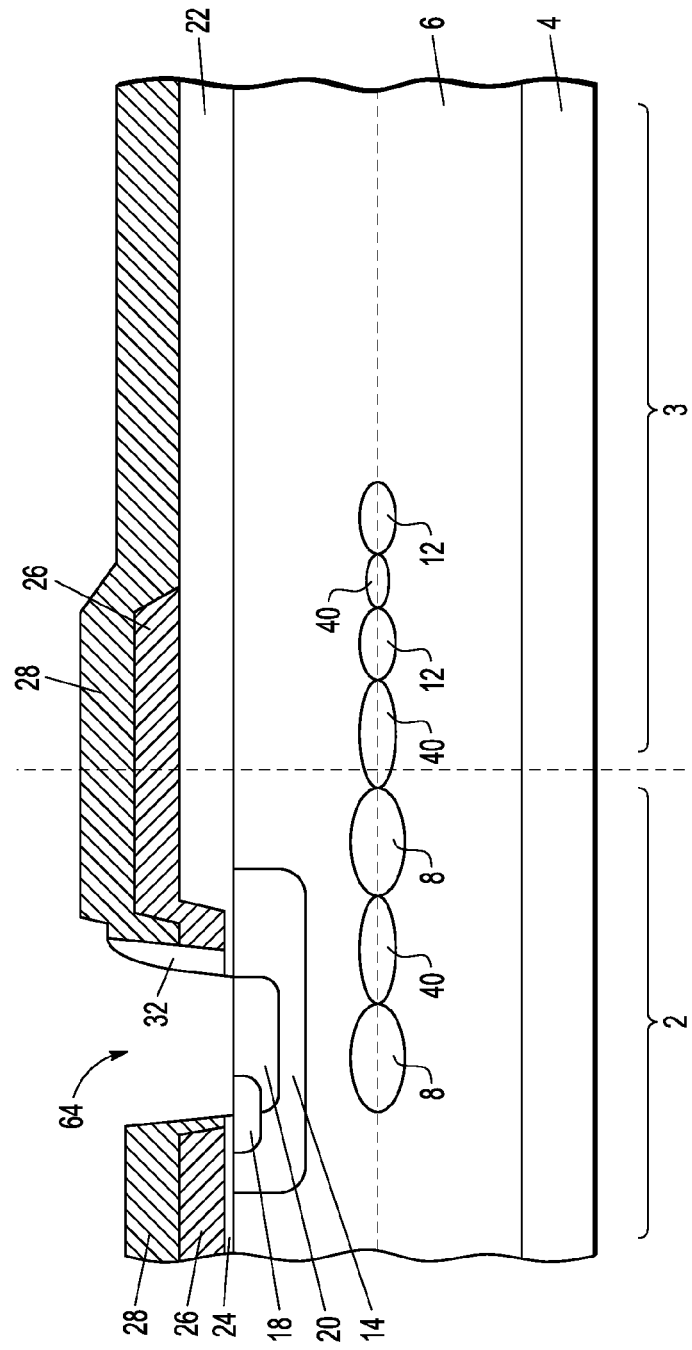

Referring now to FIG. 8, a dielectric layer (not shown), such as a TEOS layer, is formed over the dielectric layer 28 and the gate oxide layer 24. This dielectric layer (not shown) and the gate oxide layer 24 are then etched to provide a spacer 32 and opening 64, through which p-type material is implanted to form the additional p-type region 20. Preferably, the implant step comprises implanting a p-type material, such as born (B11+), having a doping dose of about 3e15 cm$^{-2}$.

The partly processed semiconductor device is then subjected to a low thermal operation and short drive so as to diffuse the source region 18, body region 14, and additional p-type region 20 into the epitaxial layer 6. For example, the semiconductor device is annealed up to a temperature of 900-950° C. for 30 minutes. Other process steps then take place including metallization wherein a metal layer 30 is formed on the dielectric layer 28 in contact with the source region 18 so as to provide the source electrode, a metal layer 34 is formed over the second surface of the semiconductor substrate 4 to form the drain electrode and a metal layer 36 is formed over the dielectric layer 28 and contacts the insulated gate region 26 to form the gate electrode, as shown in FIG. 1. The spacer 32 isolates the source electrode 30 from the insulated gate region 26.

It will be appreciated that for the embodiments described above since the termination regions 12 are formed when the floating regions 8 are formed, the termination structure in accordance with the present invention does not require any additional masks or implant steps and so there is no significant increase in manufacturing costs compared to the known termination techniques which require additional process steps. Furthermore, as the termination regions are buried in the epitaxial region, the size of the die is not increased as much as is the case when the termination regions are formed at the surface.

In summary, the present invention provides an improved semiconductor device that has at least one termination region formed buried in the epitaxial layer in the termination area surrounding the active area of the device wherein the doping concentration of the at least one termination region is less than the doping concentration of a floating region in the active area. The doping gradient between the floating regions in the active area and the termination regions in the termination area relaxes the potential at depletion and spreads the potential curvature away from the last PN junction and if used, the edge of the field plate, so that the peak electric field close to the surface of the epitaxial layer is decreased. The result is that breakdown voltage capability of the termination area can be arranged to approach the ideal plane parallel breakdown voltage capability which improves the trade-off between reducing Rdson and having a high enough break down voltage BVdss.

The doping gradient between the floating regions and termination regions is achieved by patterning a mask layer such that the mask portions which define the floating regions and termination regions have different widths. This means that the floating regions and termination regions can be produced in the same implant step which avoids the need for additional process steps.

It will be appreciated that a MOSFET device will comprise a plurality of base cells in the active area in which a plurality of floating regions will be uniformly distributed. The floating regions may be formed having different configurations such as stripes, dots, mesh shapes, cross shapes or any combination thereof. The termination structure in the termination area may also be formed having different configurations such as a plurality of termination regions arranged in stripes, or dots, or crosses or any combination thereof.

The invention claimed is:

1. A method of forming a semiconductor device having an active area and a termination area surrounding the active area comprising:
   providing a semiconductor substrate;
   providing a semiconductor layer of a first conductivity type over the semiconductor substrate;
   forming a mask layer over the semiconductor layer, the mask layer outlining at least three portions of a surface of the semiconductor layer, a first outlined portion outlining a floating region in the active area a second outlined portion outlining a first termination region in the termination area and a third outlined portion outlining a second termination region in the termination area; and providing dopant of a second conductivity type to the first, second and third outlined portions so as to provide a floating region of the second conductivity type buried in the semiconductor layer in the active area and first and second termination regions of the second conductivity type buried in the semiconductor layer in the termination area of the semiconductor device;

wherein a distance between the second outlined portion and the third outlined portion is less than a lateral spread of the dopant through the semiconductor layer such that the step of providing dopant to the second and third outlined portions provides a merged termination region in the termination area.

2. The method according to claim 1 wherein the doping concentration of the semiconductor material in the floating region is greater than the doping concentration of the semiconductor material in the first termination region.

3. The method according to claim 1, wherein the first outlined portion has a first width and the second outlined portion has a second width and wherein the first width is greater than the second width.

4. The method according to claim 1, wherein the forming a mask layer step comprises forming a mask layer over the semiconductor layer having at least three openings, a first opening corresponding to the first outlined portion and second and third openings corresponding to the second and third outlined portions, and wherein the providing dopant step comprises providing the dopant through the first, second and third openings into the semiconductor layer.

5. The method according to claim 3, wherein the third outlined portion has a third width, the third width being substantially the same as the second width.

6. The method according to claim 3, wherein the first termination region is located in the semiconductor layer between the floating region and the second termination region, wherein the third outlined portion has a third width, the third width being less than the second width such that the doping concentration of the semiconductor material in the first termination region is greater than the doping concentration of the semiconductor material in the second termination region.

7. The method according to claim 1, wherein the step of providing dopant includes the step of driving the dopant into the semiconductor layer so as to form the floating region and the first and second termination regions buried in the semiconductor layer.

8. The method according to claim 1, further comprising:
    forming a field plate extending across a portion of the semiconductor layer in the termination area adjacent the active area; and
    forming at least one termination region buried in the semiconductor layer in the termination area, the at least one termination region extending to a distance from an edge of the field plate.

9. The method according to claim 1, wherein a plurality of termination regions are formed buried in the semiconductor layer in the termination area and wherein a distance between an outlined portion of the mask layer outlining a termination region and an outlined portion outlining an adjacent termination region varies away from the active area.

10. The method according to claim 1, wherein a plurality of termination regions are formed buried in the semiconductor layer in the termination area and wherein the doping concentration of the dopant in the plurality of termination regions varies away from the active area.

11. The method according to claim 1, wherein a plurality of termination regions are formed buried in the semiconductor layer in the termination area and wherein the method further comprises the step of forming enhancement regions of the first conductivity type buried in the semiconductor layer between the termination regions.

12. The method according to claim 1, wherein a plurality of floating regions are formed buried in the semiconductor layer in the active area and wherein the method further comprises the step of forming enhancement regions of the first conductivity type buried in the semiconductor layer between the floating regions.

13. The method according to claim 1, wherein a shape of the second outlined portion of the mask layer defines a shape of the first termination region, the shape of the first termination region being one of stripe, dot, mesh shape, and cross-shape.

14. The method according to claim 1, wherein the semiconductor device comprises any one of the following devices: MOSFET, IGBT, JFET, diode.

15. A semiconductor device formed according to the method of claim 1.

16. The method according to claim 2, wherein the first outlined portion has a first width and the second outlined portion has a second width and wherein the first width is greater than the second width.

17. The method according to claim 2, wherein the forming a mask layer step comprises forming a mask layer over the semiconductor layer having at least three openings, a first opening corresponding to the first outlined portion and second and third openings corresponding to the second and third outlined portions, and wherein the providing dopant step comprises providing the dopant through the first, second and third openings into the semiconductor layer.

18. The method according to claim 2, further comprising:
    forming a field plate extending across a portion of the semiconductor layer in the termination area adjacent the active area; and
    forming at least one termination region buried in the semiconductor layer in the termination area, the at least one termination region extending to a distance from an edge of the field plate.

19. The method according to claim 10, wherein a plurality of floating regions are formed buried in the semiconductor layer in the active area and wherein the method further comprises the step of forming enhancement regions of the first conductivity type buried in the semiconductor layer between the floating regions.

20. The method according to claim 8, wherein a plurality of floating regions are formed buried in the semiconductor layer in the active area and wherein the method further comprises the step of forming enhancement regions of the first conductivity type buried in the semiconductor layer between the floating regions.

* * * * *